United States Patent
Emoto et al.

(10) Patent No.: US 9,252,762 B2
(45) Date of Patent: Feb. 2, 2016

(54) PULSE GENERATION DEVICE AND PULSE GENERATION METHOD

(71) Applicant: MITSUBISHI HITACHI POWER SYSTEMS, LTD., Kanagawa (JP)

(72) Inventors: Hideaki Emoto, Tokyo (JP); Mitsuyuki Shirae, Tokyo (JP)

(73) Assignee: MITSUBISHI HITACHI POWER SYSTEMS, LTD., Kanagawa (JP)

( * ) Notice: Subject to any disclaimer, the term of this patent is extended or adjusted under 35 U.S.C. 154(b) by 85 days.

(21) Appl. No.: 14/348,264

(22) PCT Filed: Oct. 4, 2012

(86) PCT No.: PCT/JP2012/075786
§ 371 (c)(1),
(2) Date: Mar. 28, 2014

(87) PCT Pub. No.: WO2013/054730
PCT Pub. Date: Apr. 18, 2013

(65) Prior Publication Data
US 2014/0253257 A1    Sep. 11, 2014

(30) Foreign Application Priority Data

Oct. 13, 2011    (JP) .................................. 2011-225922

(51) Int. Cl.
*H03K 7/08*    (2006.01)
(52) U.S. Cl.
CPC .................................... *H03K 7/08* (2013.01)

(58) Field of Classification Search
CPC ........................................................ H03K 7/08
USPC ..................................... 332/106, 109; 327/175
See application file for complete search history.

(56) References Cited

U.S. PATENT DOCUMENTS

| | | | |
|---|---|---|---|
| 5,177,373 A | 1/1993 | Nakamura | |
| 2002/0043242 A1 | 4/2002 | Ikeda et al. | |
| 2010/0277214 A1* | 11/2010 | Chang et al. | ............... 327/175 |

FOREIGN PATENT DOCUMENTS

| | | |
|---|---|---|
| EP | 1 199 455 | 4/2002 |
| JP | 4-137817 | 5/1992 |
| JP | 2000-145597 | 5/2000 |
| JP | 2001-178143 | 6/2001 |
| JP | 2001-318721 | 11/2001 |

(Continued)

OTHER PUBLICATIONS

International Search Report issued Jan. 15, 2013 in International Application No. PCT/JP2012/075786.

(Continued)

*Primary Examiner* — Jeffrey Shin
(74) *Attorney, Agent, or Firm* — Wenderoth, Lind & Ponack, L.L.P.

(57) ABSTRACT

A pulse generation circuit (12) includes a PWM waveform outputting part (20) which outputs a PWM waveform having a duty ratio in which one linear PWM pulse is defined with a first number of bits, an input connector (22) which receives as an input a control signal indicating a duty ratio defined with a second number of bits larger than the first number of bits, and a setting part (24) which sets a PWM waveform to be output from the PWM waveform outputting part (20) based on the control signal input to the input connector (22) with one cycle being made up of a set comprised of a plurality of consecutive linear PWM pulses according to the second number of bits.

2 Claims, 9 Drawing Sheets

(56) References Cited

FOREIGN PATENT DOCUMENTS

| | | |
|---|---|---|
| JP | 2002-122036 | 4/2002 |
| JP | 2003-338738 | 11/2003 |
| JP | 2006-295320 | 10/2006 |
| JP | 2012-39499 | 2/2012 |

OTHER PUBLICATIONS

Written Opinion of the International Searching Authority issued Jan. 15, 2013 in International Application No. PCT/JP2012/075786.

Extended European Search Report issued May 8, 2015 in corresponding European patent application No. 12840602.2.

* cited by examiner

PULSE GENERATION DEVICE AND PULSE GENERATION METHOD

TECHNICAL FIELD

The present invention relates to a pulse generation device and a pulse generation method.

BACKGROUND ART

Pulse Width Modulation (PWM) which modulates a duty ratio of a pulse to be output is a widely-known technique.

Pulse width modulation is, for example, as disclosed in PTL 1, used to control ON and OFF of a transistor which controls a load current in a constant current control circuit.

CITATION LIST

Patent Literature

{PTL 1}
Japanese Unexamined Patent Application, Publication No. 2001-318721

SUMMARY OF INVENTION

Technical Problem

Accuracy of a duty ratio of a pulse output through pulse width modulation depends on the number of bits which defines the duty ratio of the output pulse. That is, when the number of bits of a control signal for controlling the duty ratio of the pulse to be output from a pulse generation circuit is larger than the number of bits of the pulse to be output by the pulse generation circuit, the pulse output by the pulse generation circuit does not have accuracy of the duty ratio indicated by the control signal.

The present invention has been made in view of such circumstances, and an object of the present invention is to provide a pulse generation device and a pulse generation method which can output a PWM waveform indicating a duty ratio of higher accuracy than that defined with the number of bits which defines a duty ratio of a pulse to be output.

Solution to Problem

To solve the above problem, the pulse generation device and the pulse generation method of the present invention employ the following means.

The pulse generation device according to a first aspect of the present invention includes a PWM waveform outputting part which outputs a PWM waveform having a duty ratio in which one pulse is defined with a first number of bits, an inputting part which receives as an input a control signal that indicates a duty ratio defined with a second number of bits larger than the first number of bits, and a setting part which sets the PWM waveform to be output by the PWM waveform outputting part based on the control signal input to the inputting part with one cycle being made up of a set comprised of a plurality of consecutive pulses according to the second number of bits.

According to the above aspect, the PWM waveform outputting part outputs a PWM waveform of the duty ratio in which one pulse is defined with the first number of bits. However, the control signal indicating the duty ratio input through the inputting part is defined with the second number of bits which is larger than the first number of bits. That is, one pulse output from the PWM waveform outputting part does not have accuracy of the duty ratio defined with the second number of bits.

Accordingly, the setting part sets the PWM waveform to be output by the PWM waveform outputting part based on the control signal input to the inputting part with one cycle being made up of the set comprised of the plurality of consecutive pulses according to the second number of bits. That is, because it is impossible to achieve accuracy of the duty ratio defined with the second number of bits only with one pulse defined with the first number of bits, a plurality of consecutive pulses are combined to make up one cycle, thereby achieving accuracy of the duty ratio defined with the second number of bits.

For example, when the first number of bits is 6 bits, and one pulse makes up one cycle, resolution (accuracy) of the duty ratio is 63 per one cycle, and the duty ratio can be set by about 1.6% increments. Meanwhile, when the second number of bits is 7 bits, a PWM waveform in which a set comprised of two pulses each having 6 bits makes up one cycle is output. By this means, a PWM waveform having a duty ratio virtually defined with 7 bits (6 bits×2) is output. The resolution of the duty ratio in this case is 126 per one cycle, and the duty ratio can be set by about 0.8% increments.

Accordingly, according to this aspect, it is possible to output a PWM waveform indicating the duty ratio of higher accuracy than that defined with the number of bits which defines the duty ratio of a pulse to be output.

In the above first aspect, when a difference between the second number of bits and the first number of bits is n, the number of the plurality of pulses that make up the set is preferably $2^n$.

According to the above configuration, it is possible to easily obtain the number of pulses of the first number of bits making up the set only by calculating the difference between the second number of bits and the first number of bits.

In the above first aspect, the setting part preferably performs setting so as to express, in the control signal indicated with the second number of bits, higher-order bits corresponding to the first number of bits with the one pulse defined with the first number of bits and the remaining bits with $2^n-1$ pulses (where n is a difference between the second number of bits and the first number of bits).

According to the above configuration, for example, when the first number of bits is 6 bits and the second number of bits is 7 bits, because a PWM waveform in which a set comprised of two pulses each having 6 bits makes up one cycle is output, in the control signal expressed with 7 bits, higher-order 6 bits of the control signal are expressed with one pulse, and the remaining bit of the control signal is expressed with the other pulse. Further, for example, when the first number of bits is 6 bits and the second number of bits is 8 bits, because a PWM waveform in which a set comprised of four pulses each having 6 bits makes up one cycle is output, in the control signal expressed with 8 bits, higher-order 6 bits of the control signal are expressed with one pulse and the other bits of the control signal are expressed with the remaining three pulses. Accordingly, it is possible to easily generate a plurality of pulses making up the set with the above configuration.

In the above first aspect, the setting part preferably performs setting so as to express each of the remaining bits with twice as many pulses as pulses expressing a bit of the next lower digit.

According to the above configuration, for example, when the first number of bits is 6 bits and the second number of bits is 9 bits, the first to sixth highest-order bits of the control signal are expressed with one pulse and the seventh bit of the control signal is expressed with one pulse and the eighth bit of the control signal is expressed with two pulses, i.e., twice as many pulses as the pulses expressing the seventh bit, and the ninth bit of the control signal is expressed with four pulses, i.e., twice as many pulses as the pulses expressing the eighth bit. Accordingly, it is possible to easily generate pulses expressing the bits of the control signal with this configuration.

Meanwhile, according to a second aspect of the present invention, a pulse generation method for outputting a PWM waveform having a duty ratio in which one pulse is defined with a first number of bits, includes a first stage of receiving as an input a control signal indicating a duty ratio defined with a second number of bits larger than the first number of bits, a second stage of performing setting so as to determine a set comprised of a plurality of consecutive pulses according to the second number of bits to be one cycle based on the control signal, and a third stage of outputting a PWM waveform using the set which is set in the second stage as one cycle.

Advantageous Effects of Invention

According to the present invention, it is possible to provide an advantageous effect of being capable of outputting a PWM waveform indicating a duty ratio of higher accuracy than that defined with the number of bits which defines the duty ratio of a pulse to be output.

DESCRIPTION OF EMBODIMENTS

One embodiment of a pulse generation device and a pulse width modulating method according to the present invention will be described below with reference to the accompanying drawings.

Figure 1:
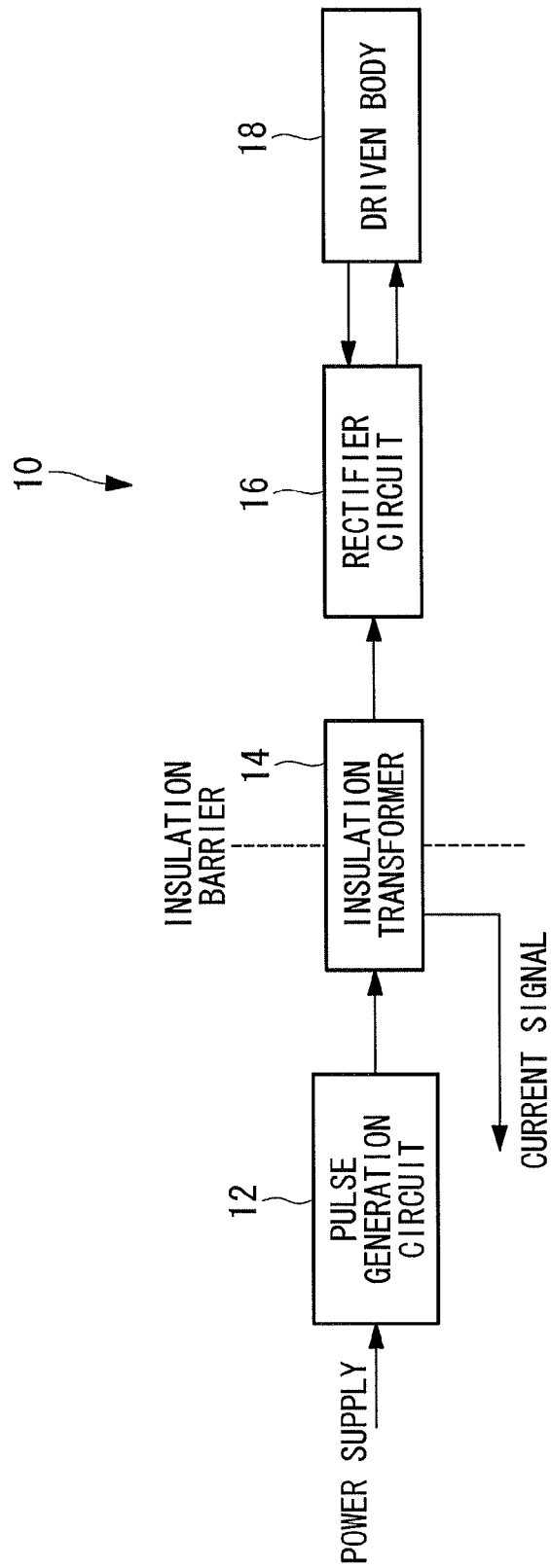
FIG. 1 is a block diagram illustrating a configuration of a drive circuit provided with a pulse generation circuit according to an embodiment of the present invention.

FIG. 1 is a block diagram illustrating a configuration of a drive circuit 10 according to this embodiment. The drive circuit 10 includes a pulse generation circuit 12, an insulation transformer 14, a rectifier circuit 16 and a driven body 18. It should be noted that a current flowing at a primary side of the insulation transformer 14 is measured by a current measuring device (not shown).

In the drive circuit 10 according to this embodiment, the pulse generation circuit 12 which outputs power as a pulse voltage is provided at the primary side of the insulation transformer 14, and the driven body 18 which performs any of measurement, drive and control is connected to a secondary side through the rectifier circuit 16. The drive circuit 10 measures change of a current at the primary side which is caused by power consumption by the driven body 18 connected at the secondary side, and performs measurement by a measuring means, drive and control by means such as a driving means and a control means, and diagnoses whether there is disconnection or short circuit in a target circuit and a signal state, that is, performs health diagnostics.

Figure 2:
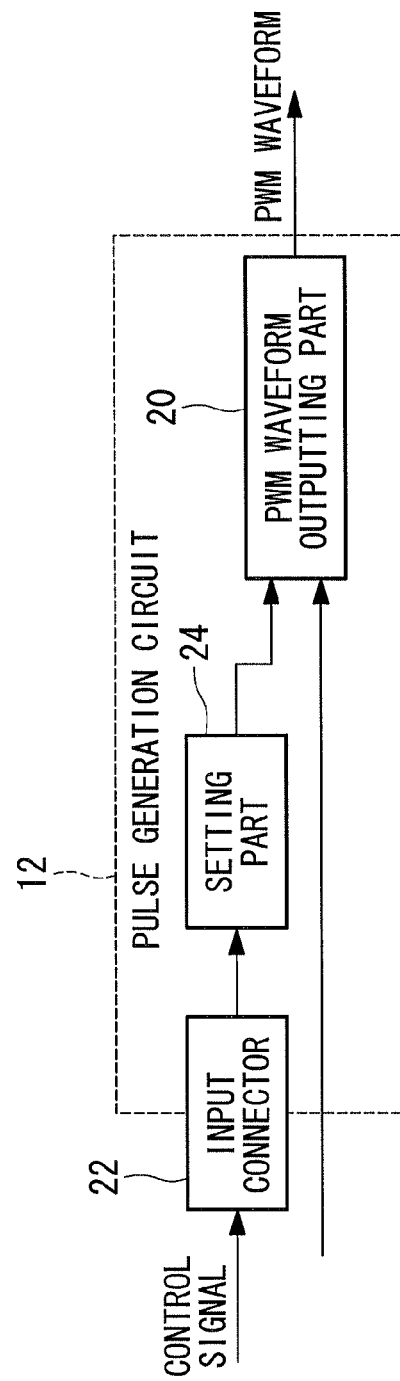
FIG. 2 is a functional block diagram illustrating a function of the pulse generation circuit according to the embodiment of the present invention.

FIG. 2 is a functional block diagram illustrating a function of the pulse generation circuit 12 according to this embodiment. The pulse generation circuit 12 includes a PWM waveform outputting part 20 which outputs a PWM (Pulse Width Modulation) waveform having a duty ratio in which one pulse is defined with the first number of bits, and an input connector 22 which receives input of a control signal indicating a duty ratio defined with the second number of bits larger than the first number of bits.

Figure 3:
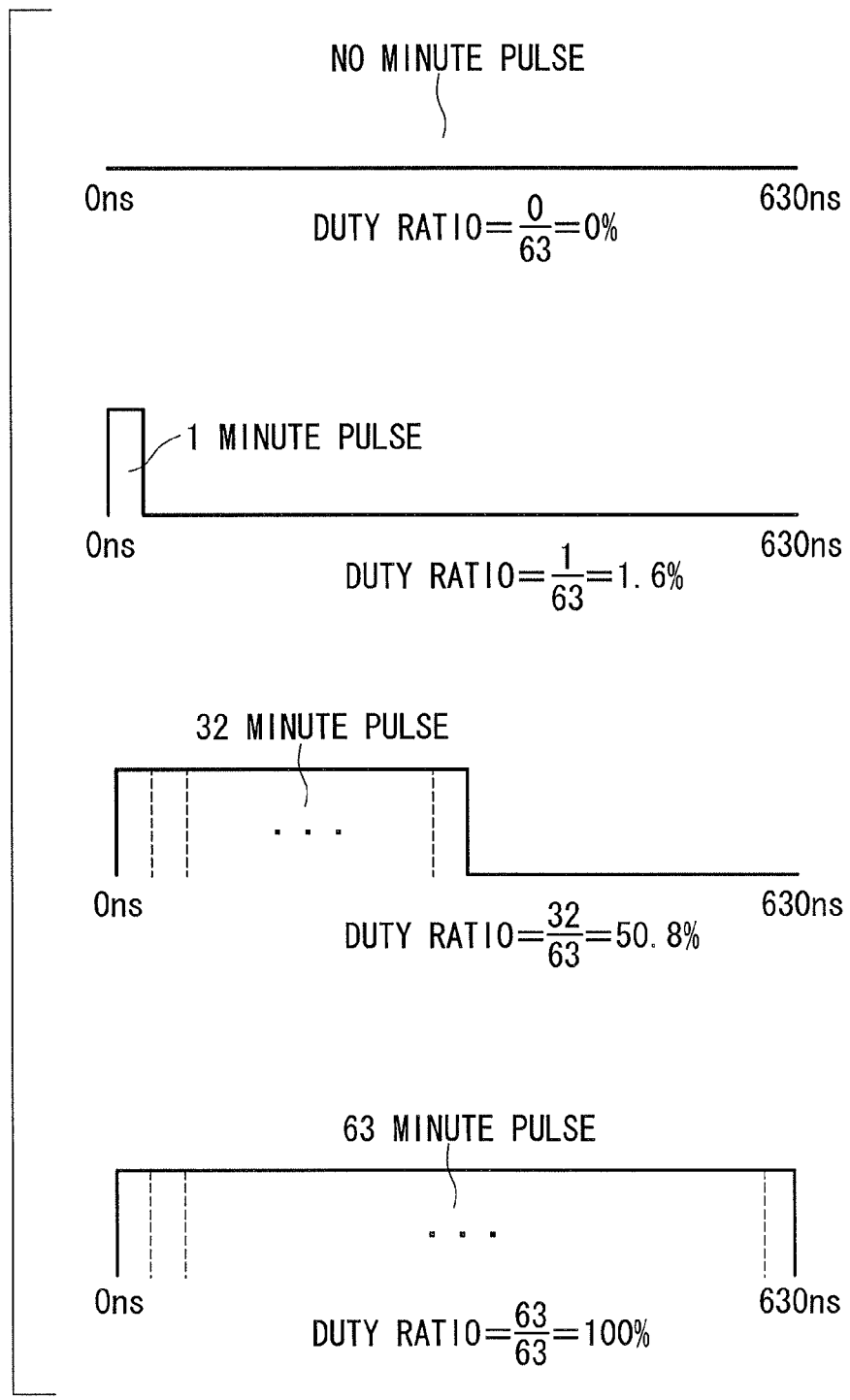
FIG. 3 illustrates an example of a PWM pulse having a duty ratio defined with 6 bits according to the embodiment of the present invention.

It should be noted that, as shown in FIG. 3 as an example, the pulse generation circuit 12 according to this embodiment outputs a PWM pulse having 6 bits, that is, resolution (accuracy) of 63 with a period of 630 ns (100/63=1.58 MHz) by repeating a waveform with 0 to 63 minute pulses of 10 ns (100 MHz). That is, in the pulse generation circuit 12, the first number of bits is 6 bits and the duty ratio of the PWM pulse can be set by about 1.6% increments.

Meanwhile, because the second number of bits of the control signal input to the pulse generation circuit 12 is set, for example, 20 bits, resolution 1032192 of the control signal of 20 bits cannot be realized only with the PWM pulse of 6 bits.

Therefore, the pulse generation circuit 12 includes the setting part 24 which sets a PWM waveform to be output from the PWM waveform outputting part 20 based on the control signal input to the input connector 22 so that a set comprised of a plurality of consecutive PWM pulses according to the second number of bits makes up one cycle.

That is, because it is impossible to achieve accuracy of the duty ratio defined by the control signal of 20 bits with one PWM pulse of 6 bits, a plurality of consecutive PWM pulses each having 6 bits are combined to thereby achieve accuracy of the duty ratio defined with 20 bits.

A case will be specifically described below where a plurality of PWM pulses each having 6 bits are used to virtually output a PWM pulse of 7 bits or more. In the following description, a PWM pulse of 6 bits is referred to as a linear PWM pulse, and a PWM pulse of 7 bits or more is simply referred to as a PWM pulse.

Figure 4:
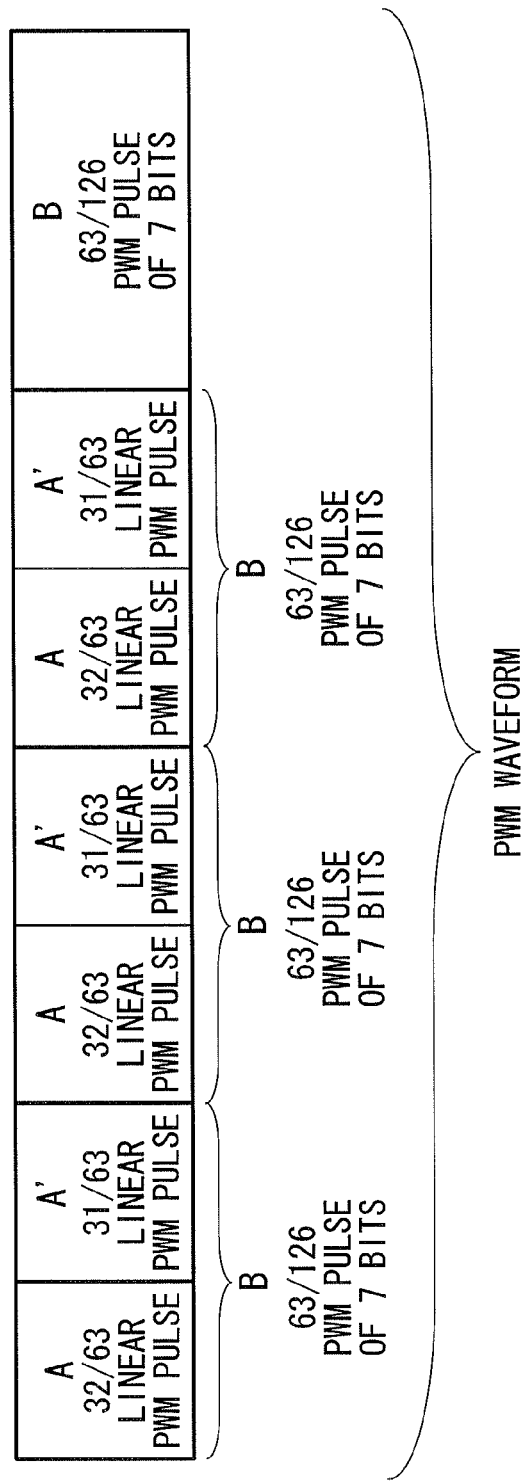
FIG. 4 illustrates an example of setting when a PWM pulse having 7 bits is virtually output using a linear PWM pulse having 6 bits according to the embodiment of the present invention.

FIG. 4 illustrates an example of setting when a PWM pulse of 7 bits is virtually output using a linear PWM pulse of 6 bits by the setting part 24. It should be noted that a duty ratio can be set by about 0.8% increments in the PWM pulse of 7 bits.

When the PWM pulse of 7 bits having resolution 126 is output using the linear PWM pulse of 6 bits having resolution 63, the PWM pulse of 7 bits having resolution 126 can be achieved by combining two cycles of the linear PWM pulse of 6 bits. By consecutively outputting the PWM pulses of 7 bits set in this manner, a PWM waveform is formed.

In the example of FIG. 4, a set comprised of a linear PWM pulse A having a duty ratio of 50.8% (32/63≈50.8) and a linear PWM pulse A' having a duty ratio of 49.2% (31/63≈49.2) is repeatedly output, thereby virtually realizing a PWM waveform by a PWM pulse B of 7 bits (6 bits×2=7 bits) having a duty ratio of 50% (63/126=50). It should be noted that because the PWM pulse B of 7 bits is realized by combining two linear PWM pulses each having 6 bits, the cycle is 1.26 μs (790 kHz).

Figure 5:
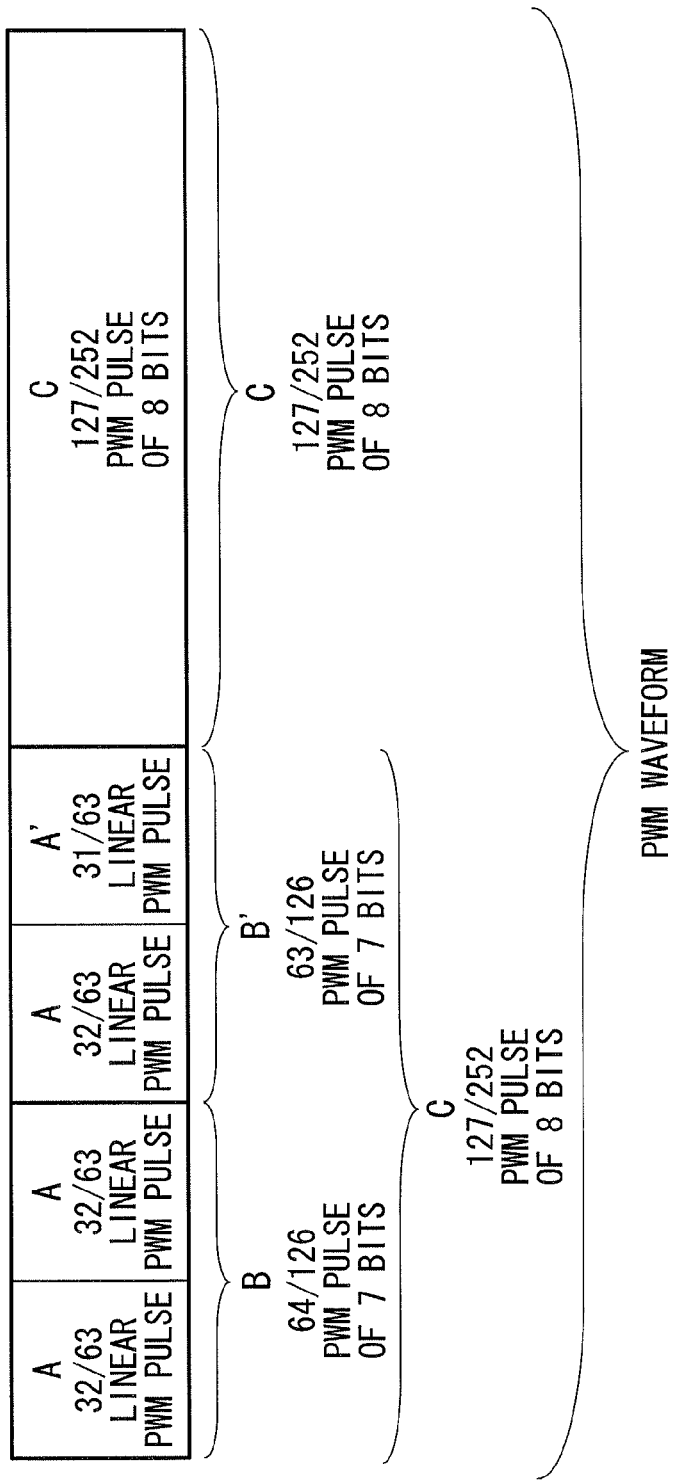
FIG. 5 illustrates an example of setting when a PWM pulse having 8 bits is virtually output using a linear PWM pulse having 6 bits according to the embodiment of the present invention.

FIG. 5 illustrates an example of setting when a PWM pulse of 8 bits is virtually output using a linear PWM pulse of 6 bits by the setting part 24. It should be noted that a duty ratio can be set by about 0.4% increments in the PWM pulse of 8 bits.

When the PWM pulse of 8 bits having resolution of 252 is output using the linear PWM pulse of 6 bits, the PWM pulse of 8 bits having resolution of 252 can be realized by combining two cycles of a PWM pulse of 7 bits, that is, four cycles of the linear PWM pulse of 6 bits.

In the example of FIG. 5, a PWM pulse B of 7 bits is made up of a set which is comprised of two cycles of the linear PWM pulse A having a duty ratio of 50.8% (32/6350.8), and a PWM pulse B' of 7 bits is made up of a set which is comprised of a linear PWM pulse A having a duty ratio of 50.8% (32/63≈50.8) and a linear PWM pulse A' having a duty ratio of 49.2% (31/63≈49.2). By repeatedly outputting a set comprised of the PWM pulse B and the PWM pulse B' of 7 bits, a PWM waveform by a PWM pulse C of 8 bits having a duty ratio of 50.4% (127/252=50.4) is virtually realized. It should be noted that because the PWM pulse C of 8 bits is realized by combining four linear PWM pulses, the cycle is 2.52 μs (395 kHz).

In a similar manner, the setting part 24 virtually sets a PWM pulse of 20 bits by increasing the number of linear PWM pulses to be combined. It should be noted that the PWM pulse of 20 bits is realized by combining two cycles of a PWM pulse of 19 bits, that is, combining 16,384 linear PWM pulses. By this means, it is possible to realize a PWM waveform by the PWM pulse having resolution of 1032192 which cannot be realized with the linear PWM pulse of 6 bits. It should be noted that the PWM pulse of 20 bits has a cycle of 10.3 ms (96.5 Hz).

In this way, by temporally changing the duty ratio of the linear PWM pulse to be set by the setting part 24, the pulse generation circuit 12 outputs a PWM waveform showing a duty ratio having higher accuracy than that defined with the number of bits which defines the duty ratio of the linear PWM pulse. In other words, the pulse generation circuit 12 generates a pulse by combining PWM and PDM (Pulse Density Modulation).

Further, when a difference between the first number of bits and the second number of bits (hereinafter, a "bit difference") is n, the number of a plurality of linear PWM pulses making up a set is $2^n$, for example, two in a case where the first number of bits is 6 bits and the second number of bits is 7 bits, four in a case where the first number of bits is 6 bits and the second number of bits is 8 bits, eight in a case where the first number of bits is 6 bits and the second number of bits is 9 bits, and 16384 in a case where the first number of bits is 6 bits and the second number of bits is 20 bits. Accordingly, the setting part 24 can simply obtain the number of linear PWM pulses making up the PWM pulse having the second number of bits by calculating the difference between the second number of bits and the first number of bits.

A method for determining a duty ratio of each of the linear PWM pulses making up the PWM pulse having the second number of bits will be described below.

As described above, the PWM pulse having the second number of bits is realized with one cycle of a set comprised of a plurality of linear PWM pulses. That is, as long as a duty ratio of the PWM pulse having the second number of bits comprised of a plurality of linear PWM pulses matches the duty ratio indicated by the control signal, each of the linear PWM pulses making up the set may have any duty ratio.

However, in order to implement (program) a function of the setting part 24 in the pulse generation circuit 12, the duty ratio of each of the linear PWM pulses making up the set is preferably determined to have regularity.

Therefore, the setting part 24 according to this embodiment performs setting so that, in the control signal expressed with the second number of bits, higher-order bits corresponding to the first number of bits are expressed with one linear PWM pulse and the remaining bits are expressed with $2^n-1$ linear PWM pulses, where n is a bit difference. Further, the higher-order bits corresponding to the first number of bits are higher-order bits having the same number of bits as the first number of bits, and when the first number of bits is 6 bits, the higher-order bits are higher-order 6 bits.

Figure 6:
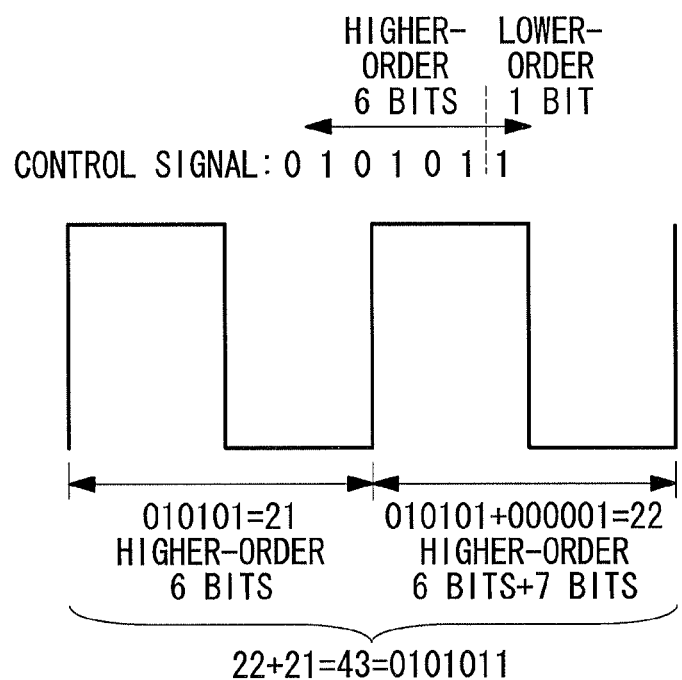
FIG. 6 is a schematic diagram illustrating a PWM pulse when a control signal is "0101011" according to the embodiment of the present invention.

FIG. 6 is a specific example of setting by the setting part 24 and illustrates a PWM waveform output when the first number of bits is 6 bits, the second number of bits is 7 bits and the control signal is "0101011" (=43). In this case, the bit difference n is 7−6=1. As shown in FIG. 6, in the control signal of 7 bits, higher-order 6 bits "010101" (=21) corresponding to 6 bits of the first number of bits are expressed with one linear PWM pulse, and the seventh bit "010101+000001" (=21+1=22) which is the remaining lower-order 1 bit is expressed with one ($2^1-1=1$) linear PWM pulse.

Figure 7:
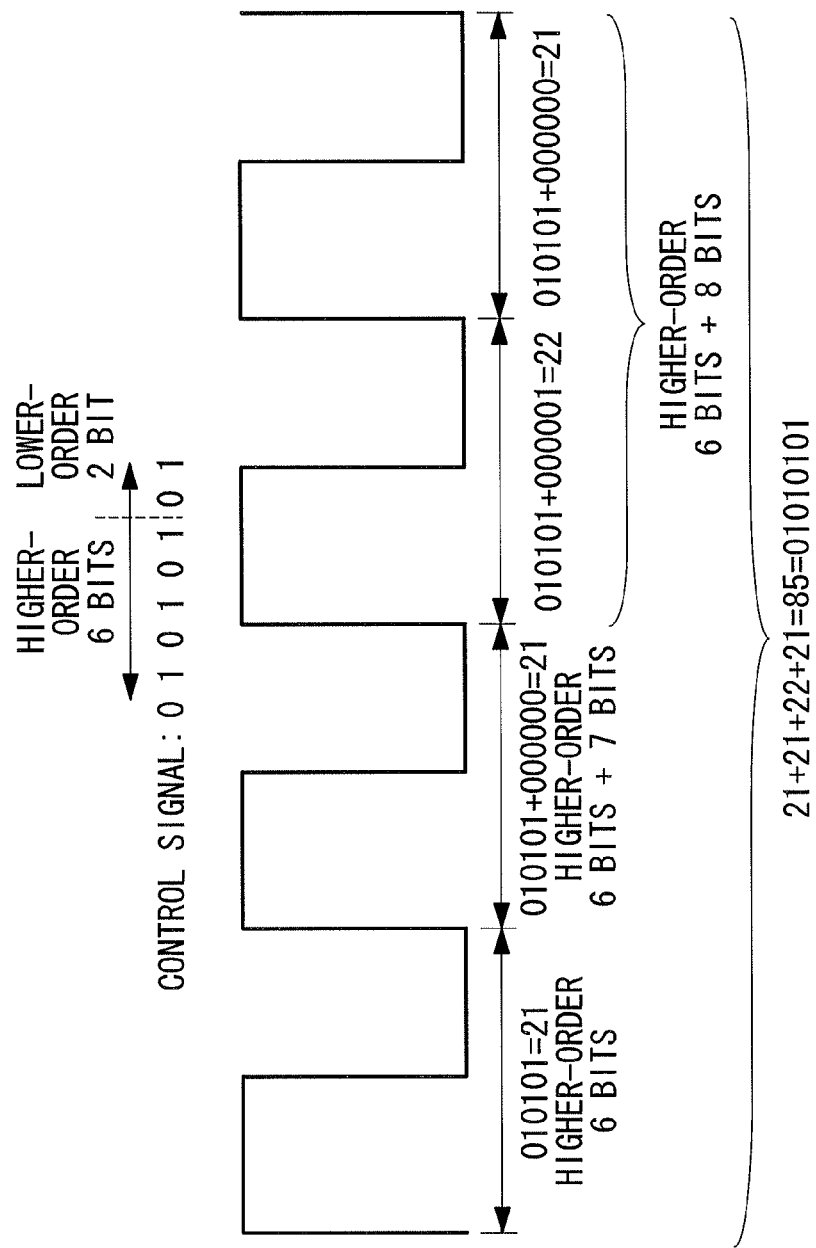
FIG. 7 is a schematic diagram illustrating a PWM pulse when the control signal is "01010101" according to the embodiment of the present invention.
Figure 8:
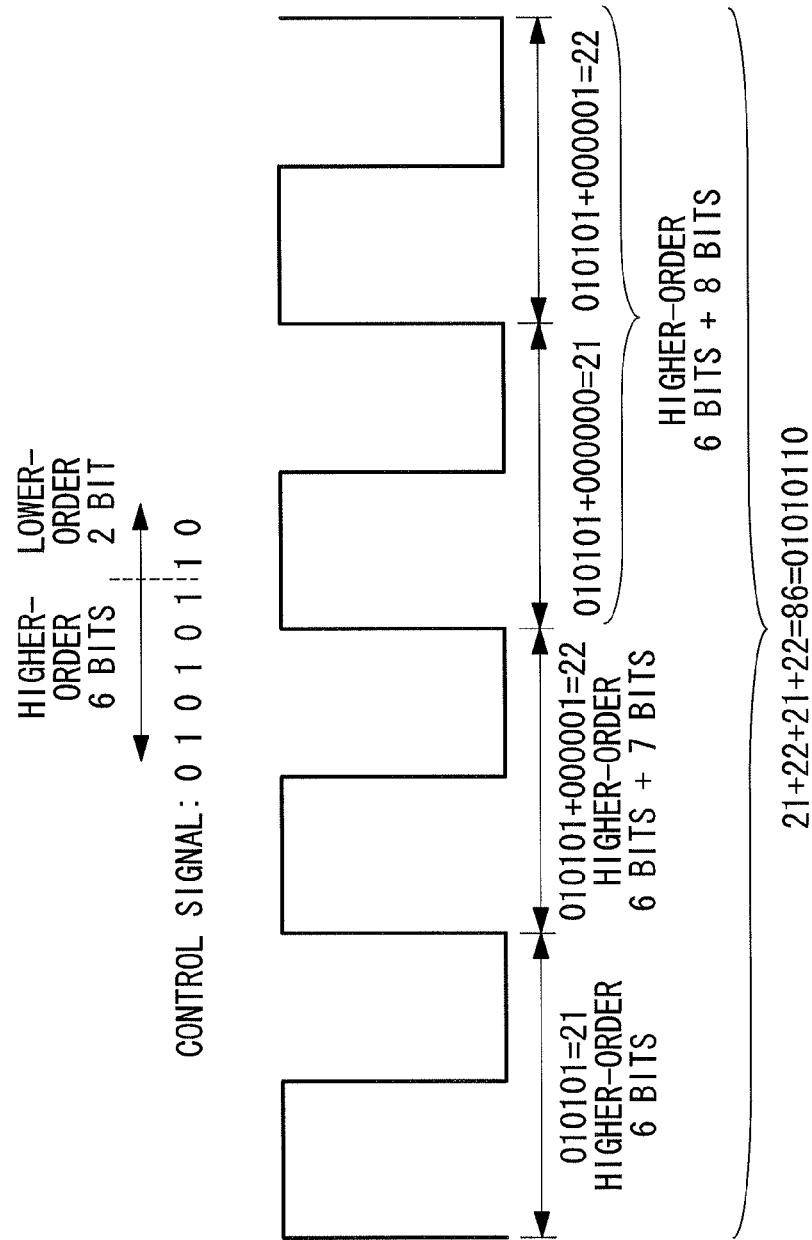
FIG. 8 is a schematic diagram illustrating a PWM pulse when the control signal is "01010110" according to the embodiment of the present invention.

FIG. 7 illustrates a PWM waveform when the control signal is 8 bits of "01010101" (=85). In this case, the bit difference n is 8−6=2. As shown in FIG. 8, in the control signal, higher-order bits "010101" (=21) corresponding to 6 bits of the first number of bits are expressed with the linear PWM pulses, and the remaining lower-order 2 bits are expressed with three ($2^2-1=3$) linear PWM pulses. In the example of FIG. 7, the seventh bit of the control signal is expressed with one linear PWM pulse, and the eighth bit is expressed with two linear PWM pulses. Specifically, the linear PWM pulse for the seventh bit expresses "010101+000000" (=21+0=21), and the two linear PWM pulses for eighth bit respectively express "010101+000001" (=21+2=22) and "010101+000000" (=21+0=21).

FIG. 8 illustrates a PWM waveform when the control signal is 8 bits of "01010110" (=86). As shown in FIG. 8, in the control signal, higher-order bits "010101" (=21) corresponding to 6 bits of the first number of bits are expressed with one linear PWM pulse, and the remaining seventh bit is expressed with one linear PWM pulse in a similar manner to the example of FIG. 7, and the eighth bit is expressed with two linear PWM pulses. In the example of FIG. 8, the linear PWM pulse for the seventh bit expresses "010101+000001" (=21+1=22), and the linear PWM pulses for the eighth bit respectively express "010101+000000" (=21+0=21) and "010101+000001" (=21+1=22).

Further, when the control signal is, for example, 10 bits, in the control signal, higher-order 6 bits corresponding to 6 bits of the first number of bits are expressed with one linear PWM pulse, and the remaining lower-order 4 bits are expressed with 15 ($2^4-1=15$) linear PWM pulses. Specifically, the seventh bit is expressed with one linear PWM pulse, the eighth bit is expressed with two linear PWM pulses, the ninth bit is expressed with four linear PWM pulses and the tenth bit is expressed with eight linear PWM pulses.

That is, each of the remaining bits other than the higher-order bits corresponding to the first number of bits in the control signal is expressed with twice as many linear PWM pulses as the linear PWM pulses expressing a bit of the next lower digit.

The setting part 24 utilizes this feature to perform setting so that each of the remaining bits other than the higher-order bits corresponding to the first number of bits in the control signal is expressed with twice as many linear PWM pulses as the linear PWM pulses expressing a bit of the next lower digit.

Further, as described above, when one cycle of the linear PWM pulse of 6 bits is regarded as one unit, the PWM pulse of 7 bits is expressed with two cycles of the linear PWM pulse, the PWM pulse of 8 bits is expressed with four cycles of the linear PWM pulse, the PWM pulse of 9 bits is expressed with eight cycles of the linear PWM pulse, and the number of cycles of the linear PWM pulse becomes twice in a similar manner every time the digit of the bit increases by one. In other words, in the PWM waveform output from the pulse generation circuit 12, a bit expressing the seventh bit of the control signal is added for each of two cycles, a bit expressing the eighth bit of the control signal is added for each of four cycles, a bit expressing the ninth bit of the control signal is added for each of eight cycles, a bit expressing each number-th bit of the control signal is added for each of $2^n$ (n is a bit difference) cycles in a similar manner, so that there is the same recursive regularity as that can be found in increase of the digit.

This regularity will be described with reference to FIG. 9.

Figure 9:
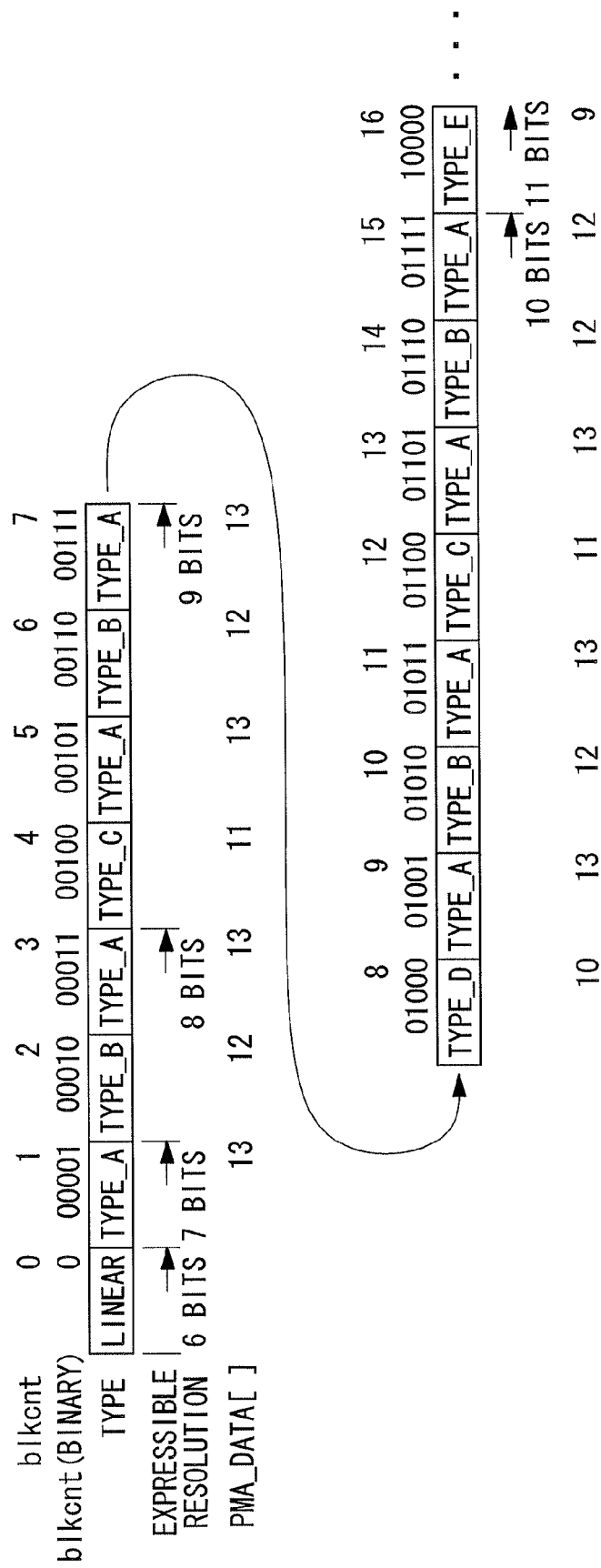
FIG. 9 is a schematic diagram used for explaining regularity of the PWM pulse according to the embodiment of the present invention.

In FIG. 9, linear represents values of higher-order 6 bits of the control signal, TYPE_A represents a value of the seventh bit of the control signal, TYPE_B represents a value of the eighth bit of the control signal, TYPE_C represents a value of the ninth bit of the control signal, TYPE_D represents a tenth bit of the control signal, and TYPE_E represents the eleventh bit of the control signal. It should be noted that the same applies hereafter, and when the control signal is expressed with 20 bits, TYPE_N represents the twentieth bit of the control signal.

Specifically, the setting part 24 sets one linear PWM pulse when the control signal has 6 bits, sets a linear PWM pulse and a linear PWM pulse expressing TYPE_A which is the seventh bit of the control signal when the control signal has 7 bits, and performs setting so that a set comprised of consecutive linear PWM pulses including a linear PWM pulse expressing TYPE_B which is the eighth bit of the control signal and a linear PWM pulse expressing TYPE_A which is the seventh bit of the control signal in addition to the linear PWM pulse and the linear PWM pulse expressing TYPE_A which is the seventh bit of the control signal is output when the control signal has 8 bits.

Further, when the control signal has 9 bits, the setting part 24 performs setting so that a set comprised of consecutive linear PWM pulses including a linear PWM pulse expressing TYPE_C which is the ninth bit of the control signal, a linear PWM pulse expressing TYPE_A which is the seventh bit of the control signal, a linear PWM pulse expressing TYPE_B which is the eighth bit of the control signal and a linear PWM pulse expressing TYPE_A which is the seventh bit of the control signal in addition to the linear PWM pulse, the linear PWM pulse expressing TYPE_A which is the seventh bit of the control signal, the linear PWM pulse expressing TYPE_B which is the eighth bit of the control signal and the linear PWM pulse expressing TYPE_A which is the seventh bit of the control signal is output.

In a similar manner, when the control signal has 10 bits, the setting part 24 performs setting so that eight linear PWM pulses including a linear PWM pulse expressing TYPE_D which is the tenth bit of the control signal are further added, and, when the control signal has 11 bits, the setting part 24 performs setting so that sixteen linear PWM pulses including a linear PWM pulse expressing TYPE_E which is the eleventh bit of the control signal are further added.

An example of a computer program for outputting the PWM waveform in the example shown in FIG. 9 will be described.

When a count for a cycle of the linear PWM pulse is expressed with "blkcnt" and a value of 20 bits to be output is expressed with "PWM_DATA[19:0]", a relationship of TYPE is as shown in the following Table 1.

TABLE 1

| | |
|---|---|
| TYPE_A | if (blkcnt [0] == "1") PWM VALUE = PWM_DATA [19:14] + PWM_DATA [13] |
| TYPE_B | if (blkcnt [1:0] == "10") PWM VALUE = PWM_DATA [19:14] + PWM_DATA [12] |
| TYPE_C | if (blkcnt [2:0] == "100") PWM VALUE = PWM_DATA [19:14] + PWM_DATA [11] |
| TYPE_D | if (blkcnt [3:0] == "1000") PWM VALUE = PWM_DATA [19:14] + PWM_DATA [10] |
| TYPE_E | if (blkcnt [4:0] == "10000") PWM VALUE = PWM_DATA [19:14] + PWM_DATA [9] |
| . | . |
| . | . |
| TYPE_N | if (blkcnt [14:0] == "100000000000000") PWM VALUE = PWM_DATA [19:14] + PWM_DATA [0] |

It should be noted that a PWM value is the number of minute pulses which indicate a duty ratio included in the linear PWM pulse, and the first term of the right side in an equation which indicates the PWM value indicates values of higher-order 6 bits of the control signal. Meanwhile, the second term of the right side indicates values of higher-order 7 bits and the subsequent bits (the number-th bit which is obtained by subtracting 20 from a value in parenthesis [ ]) of the control signal.

Further, when the first number of bits is M and the second number of bits is N, the equations indicated in Table 1 can be generalized to the following equation (1). In the following equation (1), "1<<r" indicates a state where 1 is shifted to left by r bits (0≤r≤N−M−1). Further, "LINEAR_DATA" indicates a value of a PWM pulse of M bits, and "TARGET_DATA" indicates a setting value of the control signal of N bits. That is, LINEAR_DATA corresponds to the PWM value in the equation shown in Table 1, TARGET_DATA[N−1:N−M] corresponds to the first term of the right side, and TARGET_DATA[N−M−1−r] corresponds to the second term of the right side.

if(blkcnt[*r*:0]=="1<<*r*")
   {LINEAR_DATA=TARGET_DATA[N−1:*N−M*]+TARGET_DATA[*N−M*−1−*r*];}       (1)

The pulse generation circuit 12 which includes a program that uses a relational expression shown in the above Table 1 or equation (1) as the setting part 24, can easily set a plurality of linear PWM pulses making up the set.

As described above, the pulse generation circuit 12 according to this embodiment receives input of the control signal indicating the duty ratio defined with the second number of bits larger than the first number of bits, sets a set comprised of a plurality of consecutive linear PWM pulses according to the second number of bits as one cycle based on the control signal, and outputs a PWM waveform using the set set as one cycle.

Accordingly, the pulse generation circuit 12 can output a PWM waveform indicating the duty ratio having higher accuracy than that defined with the number of bits which define the duty ratio of the linear PWM pulse to be output.

Further, in the prior art, in order to increase accuracy of the duty ratio, the number of bits (the first number of bits in this embodiment) which defines the pulse to be output by the pulse generation circuit may simply be increased. In this case, when a time period corresponding to one bit is constant, a cycle of the pulse to be output becomes long. That is, even if the duty ratio with low accuracy is sufficient, the pulse generation circuit outputs a pulse with a long cycle.

However, when the duty ratio with low accuracy is sufficient, the pulse generation circuit 12 according to this embodiment reduces the second number of bits expressing the control signal, so that the pulse generation circuit 12 outputs a PWM waveform in which a set of linear PWM pulses of the small number according to the low accuracy makes up one cycle. Accordingly, the pulse generation circuit 12 according to this embodiment can output a PWM waveform having a duty ratio of low accuracy in a short cycle (short period of time).

Further, when a difference between the second number of bits and the first number of bits is n, the setting part 24 according to this embodiment sets the number of a plurality of linear PWM pulses making up the set as $2^n$. Accordingly, the pulse generation circuit 12 can easily obtain the number of linear PWM pulses of the first number of bits making up the set.

Further, the setting part 24 according to this embodiment performs setting so that, in the control signal expressed with the second number of bits, higher-order bits corresponding to the first number of bits are expressed with one linear PWM pulse defined with the first number of bits and the remaining bits are expressed with $2^n$-1 linear PWM pulses. Accordingly, the pulse generation circuit 12 can easily generate a plurality of PWM pulses making up the set.

Still further, the setting part 24 according to this embodiment performs setting so that each of the remaining bits other than the higher-order bits corresponding to the first number of bits in the control signal is expressed with twice as many linear PWM pulses as the linear PWM pulses expressing a bit of the next lower digit. Therefore, the pulse generation circuit 12 can easily generate a PWM pulse expressing the bits making up the control signal.

Although the present invention has been described above using the embodiment, the technical scope of the present invention is not limited to the scope described in the above embodiment. Various change or modification can be applied to the above embodiment without departing from the scope of the present invention, and the changed or modified embodiment is included in the technical scope of the present invention.

For example, while in the above embodiment, an embodiment where the pulse generation circuit 12 is used in the drive circuit 10 shown in FIG. 1 has been described, the present invention is not limited to this, and can be applied to an embodiment where the pulse generation circuit 12 is used in various circuits which require a PWM waveform.

Further, relational expressions shown in Table 1 or equation (1) used for the program implemented in the pulse generation circuit 12 which has been described in the above embodiment are examples, and other relational expressions can be used as the program.

REFERENCE SIGNS LIST 10 drive circuit
12 pulse generation circuit
20 PWM waveform outputting part
22 input connector
24 setting part

The invention claimed is:

1. A pulse generation device comprising:
 a PWM waveform outputting part which outputs a PWM waveform having a duty ratio in which one pulse is defined with a first number of bits;
 an inputting part which receives as an input a control signal that indicates a duty ratio defined with a second number of bits larger than the first number of bits; and
 a setting part which sets the PWM waveform to be output by the PWM waveform outputting part based on the control signal input to the inputting part with one cycle being made up of a set comprised of a plurality of consecutive pulses according to the second number of bits,
 wherein the number of the plurality of pulses making up the set is $2^n$ when a difference between the second number of bits and the first number of bits is n,
 wherein the setting part performs setting so as to express, in the control signal indicated with the second number of bits, higher-order bits corresponding to the first number of bits with the one pulse defined with the first number of bits and the remaining bits with $2^n$-1 pulses (where n is the difference between the second number of bits and the first number of bits) and
 wherein the setting part performs setting so as to express each of the remaining bits with twice as many pulses as pulses expressing a bit of the next lower digit.

2. A pulse generation method for outputting a PWM waveform having a duty ratio in which one pulse is defined with a first number of bits, the method comprising:
 a first stage of receiving as an input a control signal indicating a duty ratio defined with a second number of bits larger than the first number of bits;
 a second stage of performing setting so as to determine a set comprised of a plurality of consecutive pulses according to the second number of bits to be one cycle based on the control signal; and
 a third stage of outputting a PWM waveform using the set which is set in the second stage as one cycle,
 wherein the number of the plurality of pulses making up the set is $2^n$ when a difference between the second number of bits and the first number of bits is n,
 wherein, in the second stage, performing setting so as to express, in the control signal indicated with the second number of bits, higher-order bits corresponding to the first number of bits with the one pulse defined with the first number of bits and the remaining bits with $2^n$-1 pulses (where n is the difference between the second number of bits and the first number of bits) and
 wherein, in the second stage, performing setting so as to express each of the remaining bits with twice as many pulses as pulses expressing a bit of the next lower digit in the second stage.

\* \* \* \* \*